United States Patent
Cok et al.

(10) Patent No.: US 7,417,370 B2
(45) Date of Patent: Aug. 26, 2008

(54) OLED DEVICE HAVING IMPROVED LIGHT OUTPUT

(75) Inventors: Ronald S. Cok, Rochester, NY (US); Michael L. Boroson, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 41 days.

(21) Appl. No.: 11/387,492

(22) Filed: Mar. 23, 2006

(65) Prior Publication Data

US 2007/0222372 A1    Sep. 27, 2007

(51) Int. Cl.
*H01L 31/00* (2006.01)
*H01L 31/14* (2006.01)
*H01L 27/15* (2006.01)
*H01J 1/62* (2006.01)
*B32B 9/00* (2006.01)

(52) U.S. Cl. .................. 313/504; 250/214.1; 250/552; 257/79; 428/690

(58) Field of Classification Search ............. 250/201.1, 250/221, 214.1, 226, 552; 345/176, 39, 45, 345/46, 47; 385/14, 15; 313/504, 506, 512, 313/509, 511; 428/213, 690, 917; 257/40, 257/72, 79, 89
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 5,834,893 A | 11/1998 | Bulovic et al. | |
| 5,955,837 A | 9/1999 | Horikx et al. | |
| 6,091,195 A | 7/2000 | Forrest et al. | |
| 6,777,871 B2 | 8/2004 | Duggal et al. | |

(Continued)

FOREIGN PATENT DOCUMENTS

EP    1 603 367    12/2005

(Continued)

OTHER PUBLICATIONS

C. W. Tang and S. A. VanSlyke; "Organic Electroluminescent Diodes"; Applied Physics Letters; vol. 51; No. 12; Sep. 21, 1987; pp. 913-915.

(Continued)

*Primary Examiner*—Georgia Y. Epps
*Assistant Examiner*—Don Williams
(74) *Attorney, Agent, or Firm*—Andrew J. Anderson; Stephen H. Shaw

(57) ABSTRACT

A bottom-emitting organic light-emitting diode (OLED) device, comprising: a transparent substrate; an optical isolation cavity formed over the substrate having a refractive index lower than the refractive index of the substrate; a transparent electrode formed over the optical isolation cavity; one or more layers of organic light-emitting material formed over the transparent electrode; a second electrode formed over the one or more layers of organic light-emitting material; and a light-scattering layer formed over the optical isolation cavity; wherein the transparent electrode or a second layer formed between the optical isolation cavity and the transparent electrode comprises one or more openings leading to the optical isolation cavity, and the cavity is formed by etching a sacrificial layer deposited between the substrate and the transparent electrode or the second layer through the one or more openings.

16 Claims, 5 Drawing Sheets

U.S. PATENT DOCUMENTS

| | | |
|---|---|---|
| 6,787,796 B2 | 9/2004 | Do et al. |
| 6,920,257 B1 * | 7/2005 | Mekis et al. .................. 385/14 |
| 6,965,197 B2 * | 11/2005 | Tyan et al. .................. 313/506 |
| 7,078,293 B2 * | 7/2006 | Lin et al. .................... 438/253 |
| 7,205,718 B2 * | 4/2007 | Cok ........................... 313/512 |
| 2001/0026124 A1 | 10/2001 | Liu et al. |
| 2002/0011783 A1 | 1/2002 | Hosokawa |
| 2004/0061136 A1 | 4/2004 | Tyan et al. |
| 2004/0217702 A1 | 11/2004 | Garner et al. |
| 2005/0018431 A1 | 1/2005 | Shiang |
| 2005/0142379 A1 | 6/2005 | Juni et al. |
| 2005/0194896 A1 | 9/2005 | Sugita et al. |

FOREIGN PATENT DOCUMENTS

| | | |
|---|---|---|
| WO | WO 02/37568 | 5/2002 |
| WO | WO 02/37580 | 5/2002 |

OTHER PUBLICATIONS

C. W. Tang, S. A. VanSlyke and C. H. Chen; "Electroluminescence Of Doped Organic Thin Films"; Journal of Applied Physics; vol. 65; No. 9, May 1, 1989; pp. 3610-3616.

A. N. Safonov et al; "Modification Of Polymer Light Emission By Lateral Microstructure"; Synthetic Metals; 116; 2001; pp. 145-148.

John M. Lupton et al; "Bragg Scattering From Periodically Microstructured Light Emitting Diodes"; Applied Physics Letters; vol. 77; No. 21; Nov. 20, 2000; pp. 3340-3342.

Tetsuo Tsutsui et al; "Sharply Directed Emission In Organic Electroluminescent Diodes With An Optical-Microcavity Structure"; Applied Physics Letters; vol. 65; No. 15; Oct. 10, 1994; pp. 1868-1870.

Ronald S. Cok, Donald R. Preuss and Yuan-Sheng Tyan; U.S. Appl. No. 11/065,082, filed Feb. 24, 2005; titled "OLE Device Having Improved Light Output".

U.S. Appl. No. 11/387,489, filed Mar. 23, 2006, titled "Composite Electrode For Light-Emitting Device", by R.S. Cok.

* cited by examiner

OLED DEVICE HAVING IMPROVED LIGHT OUTPUT

FIELD OF THE INVENTION

The present invention relates to organic light-emitting diode (OLED) devices, and more particularly, to OLED device structures for improving light output.

BACKGROUND OF THE INVENTION

Organic light-emitting diodes (OLEDs) are a promising technology for flat-panel displays and area illumination lamps. The technology relies upon thin-film layers of materials coated upon a substrate. OLED devices generally can have two formats known as small-molecule devices such as disclosed in U.S. Pat. No. 4,476,292 and polymer-OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), a light-emissive layer (LEL) and an organic electron-transporting layer (ETL). Holes and electrons recombine and emit light in the LEL layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light-generating process. For example, the selection of anode and cathode materials can determine how efficiently the electrons and holes are injected into the device; the selection of ETL and HTL can determine how efficiently the electrons and holes are transported in the device, and the selection of LEL can determine how efficiently the electrons and holes are recombined and result in the emission of light, etc.

It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices. Because light is emitted in all directions from the internal layers of the OLED, some of the light is emitted directly from the device, and some is emitted into the device and is either reflected back out or is absorbed, and some of the light is emitted laterally, trapped, and absorbed by the various layers comprising the device. In general, up to 80% of the light may be lost in this manner.

A typical bottom-emitting OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In these typical devices, the index of the ITO layer, the organic layers, and the glass is about 1.8-2.0, 1.7, and 1.5 respectively. It has been estimated that nearly 60% of the generated light is trapped by internal reflection in the ITO/organic LEL element, 20% is trapped in the glass substrate, and only about 20% of the generated light is actually emitted from the device and performs useful functions.

Referring to FIG. 7, a prior-art bottom-emitting OLED has a transparent substrate 10, a transparent first electrode 12, one or more organic layers 14, one of which is light-emitting, a reflective second electrode 16, a gap 19 and an encapsulating cover 20. The encapsulating cover 20 may be opaque and may be coated directly over the second electrode 16 so that no gap 19 exists. When a gap 19 does exist, it may be filled with polymer or desiccants to add rigidity and reduce water vapor permeation into the device. Light emitted from one of the organic material layers 14 can be emitted directly out of the device, through the substrate 10, as illustrated with light ray 1. Light may also be emitted and internally guided in the substrate 10 and organic layers 14, as illustrated with light ray 2. Alternatively, light may be emitted and internally guided in the layers 14 of organic material, as illustrated with light ray 3. Light rays 4 emitted toward the reflective second electrode 16 are reflected by the reflective second electrode 16 toward the substrate 10 and then follow one of the light ray paths 1, 2, or 3.

A variety of techniques have been proposed to improve the out-coupling of light from thin-film, light-emitting devices. For example, diffraction gratings have been proposed to control the attributes of light emission from thin polymer films by inducing Bragg scattering of light that is guided laterally through the emissive layers; see "Modification of polymer light emission by lateral microstructure" by Safonov et al., Synthetic Metals 116, 2001, pp. 145-148, and "Bragg scattering from periodically microstructured light emitting diodes" by Lupton et al., Applied Physics Letters, Vol. 77, No. 21, Nov. 20, 2000, pp. 3340-3342. Brightness enhancement films having diffractive properties and surface and volume diffusers are described in WO0237568 A1 entitled "Brightness and Contrast Enhancement of Direct View Emissive Displays" by Chou et al., published May 10, 2002. The use of micro-cavity techniques is also known; for example, see "Sharply directed emission in organic electroluminescent diodes with an optical-microcavity structure" by Tsutsui et al., Applied Physics Letters 65, No. 15, Oct. 10, 1994, pp. 1868-1870. However, none of these approaches cause all, or nearly all, of the light produced to be emitted from the device. Moreover, such diffractive techniques cause a significant frequency dependence on the angle of emission so that the color of the light emitted from the device changes with the viewer's perspective.

Reflective structures surrounding a light-emitting area or pixel are referenced in U.S. Pat. No. 5,834,893 issued Nov. 10, 1998 to Bulovic et al. and describe the use of angled or slanted reflective walls at the edge of each pixel. Similarly, Forrest et al. describe pixels with slanted walls in U.S. Pat. No. 6,091,195 issued Jul. 18, 2000. These approaches use reflectors located at the edges of the light-emitting areas. However, considerable light is still lost through absorption of the light as it travels laterally through the layers parallel to the substrate within a single pixel or light emitting area.

Scattering techniques are also known. Chou (International Publication Number WO 02/37580 A1) and Liu et al. (U.S. Patent Application Publication No. 2001/0026124 A1) taught the use of a volume or surface scattering layer to improve light extraction. The scattering layer is applied next to the organic layers or on the outside surface of the glass substrate and has an optical index that matches these layers. Light emitted from the OLED device at higher than critical angle that would have otherwise been trapped can penetrate into the scattering layer and be scattered out of the device. The efficiency of the OLED device is thereby improved but still has deficiencies as explained below.

U.S. Pat. No. 6,787,796 entitled "Organic electroluminescent display device and method of manufacturing the same" by Do et al. issued Sep. 7, 2004 describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. U.S. Patent Application Publication No. 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the encapsulating cover is disclosed. US20050142379 A1 entitled "Electroluminescence device, planar light source and display using the same" describes an organic electroluminescence device including an organic layer comprising an emissive layer; a pair of electrodes comprising an anode and a cathode, and sandwiching the organic layer, wherein at least one of the electrodes is transparent; a transparent layer provided adjacent to a light extracting surface of the transparent electrode; and a region substantially disturbing reflection and retraction angle of light provided adjacent to a light extracting surface of the transparent layer or in an interior of the transparent layer, wherein the transparent layer has a refractive index substantially equal to or more than the refractive index of the emissive layer.

Light-scattering layers used externally to an OLED device are described in U.S. Patent Application Publication No. 2005/0018431 entitled "Organic electroluminescent devices having improved light extraction" by Shiang and U.S. Pat. No. 5,955,837 entitled "System with an active layer of a medium having light-scattering properties for flat-panel display devices" by Horikx, et al. These disclosures describe and define properties of scattering layers located on a substrate in detail. Likewise, U.S. Pat. No. 6,777,871 entitled "Organic ElectroLuminescent Devices with Enhanced Light Extraction" by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3).

Moreover, trapped light may propagate a considerable distance horizontally through the cover, substrate, or organic layers before being scattered out of the device, thereby reducing the sharpness of the device in pixellated applications such as displays. For example, as illustrated in FIG. 8, a pixellated bottom-emitting OLED device suggested in the prior art may include a plurality of independently controlled pixels 50, 52, 54, 56, and 58 and a scattering layer 22 located between the transparent first electrode 12 and the substrate 10. A light ray 5 emitted from the light-emitting layer may be scattered multiple times by scattering layer 22, while traveling through the substrate 10, organic layer(s) 14, and transparent first electrode 12 before it is emitted from the device. When the light ray 5 is finally emitted from the device, the light ray 5 has traveled a considerable distance through the various device layers from the original pixel 50 location where it originated to a remote pixel 58 where it is emitted, thus reducing sharpness. Most of the lateral travel occurs in the substrate 10, because that is by far the thickest layer in the package. Also, the amount of light emitted is reduced due to absorption of light in the various layers. Referring to FIG. 9, the sharpness of an active-matrix OLED device employing a light-scattering layer coated on the substrate is illustrated. The average MTF (sharpness) of the device (in both horizontal and vertical directions) is plotted for an OLED device with the light-scattering layer and without the light-scattering layer. As is shown, the device with the light-scattering layer is much less sharp than the device without the light-scattering layer, although more light was extracted (not shown) from the OLED device with the light-scattering layer.

U.S. Patent Application Publication No. 2004/0061136 entitled "Organic light emitting device having enhanced light extraction efficiency" by Tyan et al., describes an enhanced, light-extraction OLED device that includes a light-scattering layer. In certain embodiments, a low-index isolation layer (having an optical index substantially lower than that of the organic electroluminescent element) is employed adjacent to a reflective layer in combination with the light-scattering layer to prevent low-angle light from striking the reflective layer, and thereby minimize absorption losses due to multiple reflections from the reflective layer. The particular arrangements, however, may still result in reduced sharpness of the device.

EP1603367 A1 entitled "Electroluminescence Device" discloses an electroluminescent device successively comprising a cathode, an electroluminescent layer, a transparent electrode layer, an evanescent light-scattering layer comprising a matrix composed of a low-refractive material containing light-scattering particles, and a transparent sheet/plate. EP1603367 A1 also includes an internal low-refractive layer to inhibit the propagation of light in a cover or substrate.

Co-pending, commonly assigned U.S. Ser. No. 11/065, 082, filed Feb. 24, 2005, describes the use of a transparent low-index layer having a refractive index lower than the refractive index of the encapsulating cover or substrate through which light is emitted and lower than the organic layers to enhance the sharpness of an OLED device having a scattering element. Both bottom-emitting and top-emitting embodiments are described. US 20050194896 describes a nano-structure layer for extracting radiated light from a light-emitting device together with a gap having a refractive index lower than an average refractive index of the emissive layer and nano-structure layer. Processes for forming optical isolation layers having refractive index layers close to one in bottom-emitting devices, such as cavities filled with a gas, formed between a substrate and an EL element, are not specifically taught.

Materials for forming the transparent electrode of displays are well known in the art and include transparent conductive oxides (TCO's), such as indium tin oxide (ITO); thin layers of metal, such as Al, having a thickness on the order of 20 nm; and conductive polymers such as polythiophene. However, many electrode materials that are transparent, such as ITO, have relatively low conductivity, which may result in a voltage drop across the display. This in turn may cause variable light output from the light emitting elements in the display, resistive heating, and power loss. Resistance can be lowered by increasing the thickness of the transparent electrode, but this decreases transparency.

One proposed solution to this problem is to use an auxiliary electrode above or below the transparent electrode layer and located between the pixels, as taught by US2002/0011783, published Jan. 31, 2002, by Hosokawa. The auxiliary electrode is not required to be transparent and therefore can be of a higher conductivity than the transparent electrode. The auxiliary electrode is typically constructed of conductive metals (Al, Ag, Cu, Au) that are also highly reflective. However, the deposition of the auxiliary electrode typically requires expensive patterning processes. In a bottom-emitting structure, metal layers may be used as the top electrode itself and need not be patterned. However, when combined with a scattering layer adjacent the bottom transparent electrode, such a structure requires that the OLED material layers be formed over the scattering layer. Since scattering layers typically include particles with sharp edges, electrical shorts between the electrodes often result, making the OLED inoperative.

There is a need for bottom-emitting organic light-emitting diode device structures that avoid the problems noted above and improves manufacturability and the efficiency and sharpness of the resulting device.

SUMMARY OF THE INVENTION

In accordance with one embodiment, the invention is directed towards a bottom-emitting organic light-emitting diode (OLED) device, comprising: a transparent substrate; an optical isolation cavity formed over the substrate having a refractive index lower than the refractive index of the substrate; a transparent electrode formed over the optical isolation cavity; one or more layers of organic light-emitting material formed over the transparent electrode; a second electrode formed over the one or more layers of organic light-emitting material; and a light-scattering layer formed over the optical isolation cavity; wherein the transparent electrode or a second layer formed between the optical isolation cavity and the transparent electrode comprises one or more openings leading to the optical isolation cavity, and the cavity is formed by etching a sacrificial layer deposited between the substrate and the transparent electrode or the second layer through the one or more openings.

In accordance with further embodiments, the invention is also directed towards a method of making an optical isolation cavity in a bottom-emitting organic light-emitting diode (OLED) device, comprising: providing a transparent substrate; forming a first sacrificial layer over the substrate; forming a second layer over the first sacrificial layer, the second layer being etchant resistant relative to the first sacrificial layer and having openings exposing portions of the first sacrificial layer; and etching the sacrificial layer away through the openings in the second layer to form an optical isolation cavity over the substrate having a refractive index lower than the refractive index of the substrate, as well as to making OLED devices comprising such an optical cavity.

ADVANTAGES

The present invention has the advantage that it increases the light output from, and improves the sharpness of, an OLED device.

It will be understood that the figures are not to scale since the individual layers are too thin and the thickness differences of various layers too great to permit depiction to scale.

DETAILED DESCRIPTION OF THE INVENTION

Figure 1:
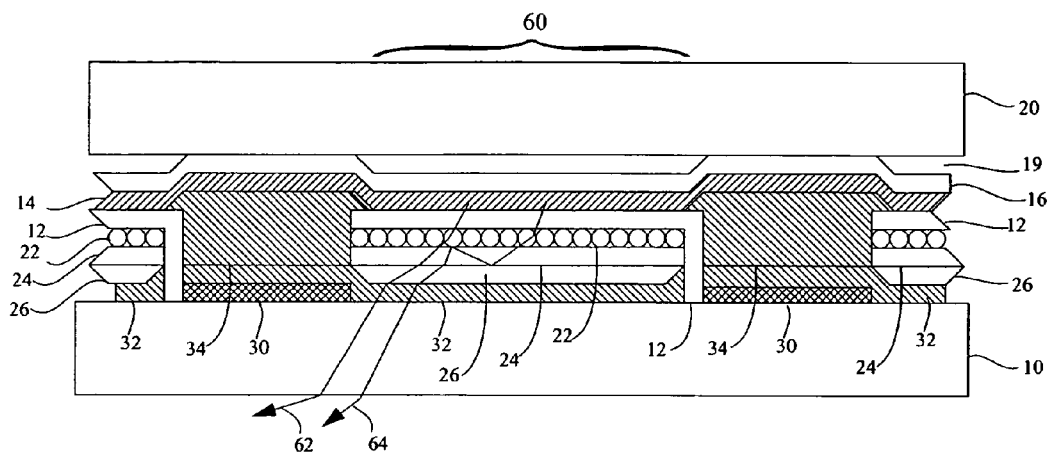
FIG. 1 illustrates a side view of an OLED device having a scattering layer adjacent to an optical isolation cavity according to one embodiment of the present invention.

Referring to FIG. 1, in accordance with one embodiment of the present invention, a bottom-emitting organic light-emitting diode (OLED) device is formed on a substrate 10. Thin-film electronic components 30 for driving an OLED are formed in a semi-conducting layer located over the substrate 10. An interlayer insulating and planarizing layer 32 is formed over the thin-film electronic components 30. An optical isolation cavity 26 is also formed over the substrate, having a refractive index that is lower than the refractive index of the substrate. A patterned transparent electrode 12 defining OLED light-emissive elements 60 is formed over the interlayer insulating and planarizing layer 32 and the optical isolation cavity 26. An insulating film 34 separates the elements 60 of the patterned transparent electrode 12. One or more layers 14 of organic light-emitting material (typically having a refractive index greater than the refractive index of the optical isolation cavity) is formed over the transparent electrode 12 and a reflective second electrode 16 is formed over the one or more layers 14 of organic light-emitting material. A light-scattering layer 22 is formed over the optical isolation cavity, and in the depicted embodiment is located between the optical isolation cavity 26 and the reflective second electrode 16. As explained in further detail below, the transparent electrode 12 or a second layer 24 formed between the optical isolation cavity 26 and the transparent electrode 12 comprises one or more openings 40 (FIGS. 4 and 5) leading to the optical isolation cavity 26, and the cavity 26 is formed by etching a sacrificial layer 26' (FIG. 6) deposited between the substrate and the transparent electrode or the second layer through the one or more openings. A gap 19 may be formed between the reflective electrode 16 and a protective cover 20 employed to protect the OLED device. The gap 19 may be completely or partially filled with desiccating or heat-conducting material.

In the embodiment of FIG. 1, light-scattering layer 22 is more specifically located between the optical isolation cavity 26 and the transparent electrode 12. In an alternative embodiment shown in FIG. 2, the second electrode 16 comprises a multi-layer composite electrode comprising a transparent conductive layer 15 and a reflective conductive layer 17 and the light-scattering layer 22 is formed between the transparent layer 15 and reflective conductive layer 17. More specifically, the second electrode may comprises transparent, conductive layer 15 formed over the one or more layers of organic light-emitting material 14 and reflective, conductive layer 17 formed over and in electrical contact with the transparent, conductive layer 15, and the scattering layer 22 is formed between the transparent and reflective conductive layers. The light-scattering layer 22 further may be formed between the transparent, conductive layer 15 and the reflective, conductive layer 17 over only a first portion of the transparent, conductive layer 15, wherein the light-scattering layer 22 is relatively less conductive than the reflective, conductive layer 17 and the reflective, conductive layer 17 is in electrical contact with the transparent, conductive layer 15 over a second portion of the transparent, conductive layer 15 where the light-scattering layer 22 is not formed. Multi-layer composite electrodes of this type that may be employed in accordance with such embodiments are described in further detail in U.S. Ser. No. 11/387,489, filed Mar. 23, 2006 by Ronald S. Cok, the disclosure of which is incorporated by reference herein. In yet another alternative embodiment shown in FIG. 3, the second electrode comprises a transparent conductive layer 15 and a reflective, light-scattering layer 23 is formed over the transparent layer 15.

Figure 2:
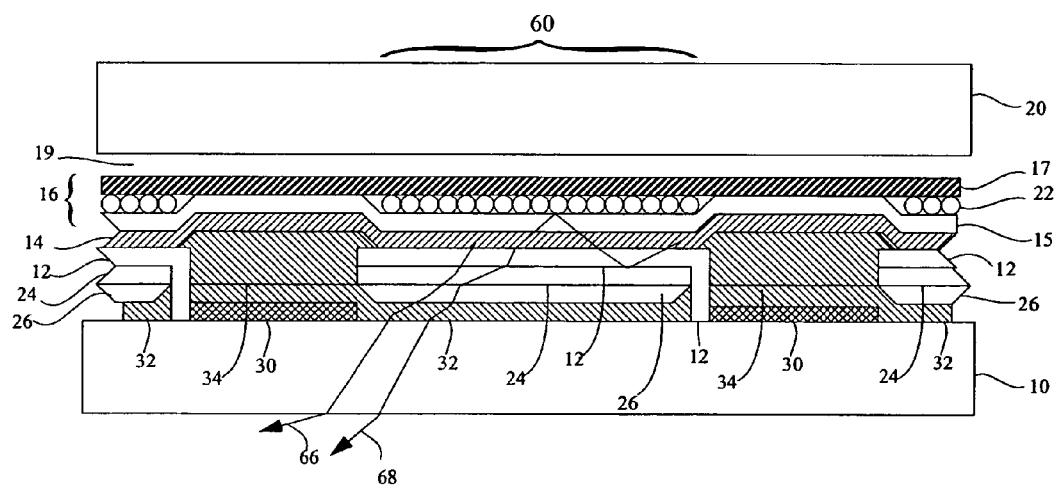
FIG. 2 illustrates a side view of an OLED device having an optical isolation cavity and a scattering layer adjacent to a reflective layer of an electrode according to an alternative embodiment of the present invention.

As employed herein, a light-scattering layer 22 is an optical layer that tends to randomly redirect any light that impinges on the layer from any direction. As used herein, a transparent electrode 12 is one that passes some light and includes electrodes that are semi-transparent, partially reflective, or partially absorptive. In various embodiments of the present invention, the scattering layer 22 may be adjacent to either electrode 12 or 16 opposite the organic layers 14 as illustrated in FIGS. 1 and 2, or between the transparent electrode 12 and reflective electrode 16 and on either side of the organic layers 14 (not shown).

The optical isolation cavity 26 may be filled with a gas, for example air or an inert gas such as nitrogen, argon or helium. This gas may be at reduced pressure compared to atmospheric pressure by forming under vacuum conditions. Preferably, the optical isolation cavity 26 is at least one micron thick, and more preferably at least two microns thick.

Figure 4:
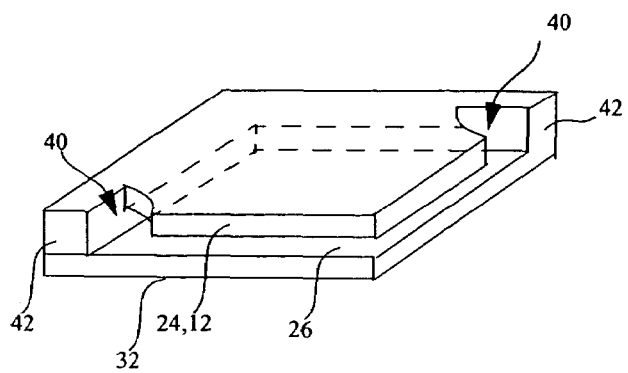
FIG. 4 is a perspective view of the optical isolation cavity and adjacent layers according to an embodiment of the present invention.
Figure 5:
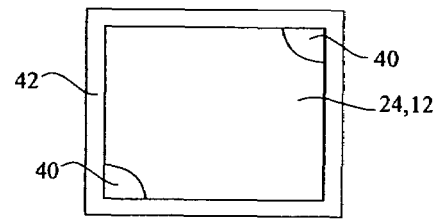
FIG. 5 is a top view of the optical isolation cavity and adjacent layers according to an embodiment of the present invention.
Figure 6:
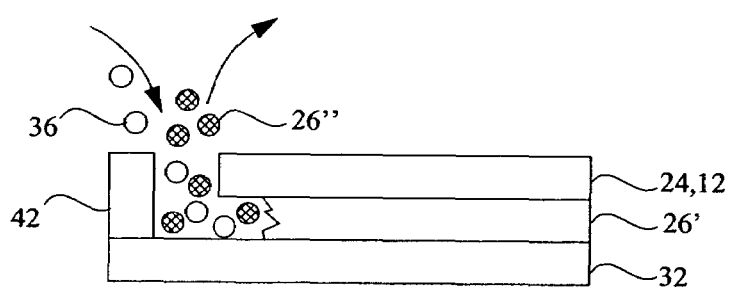
FIG. 6 is a side view of the optical isolation cavity and adjacent layers according to an embodiment of the present invention.
Figure 7:
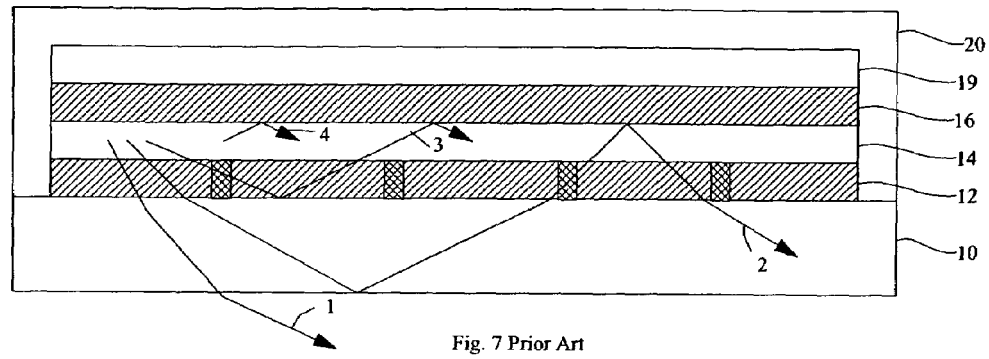
FIG. 7 illustrates a cross section of a prior-art bottom-emitter OLED device.

Referring to FIG. 4 in a perspective view, FIG. 5 in a top view, and FIG. 6 in a side view, according to an embodiment of the present invention, the optical isolation cavity 26 may be formed by depositing a sacrificial layer 26' over for example, the insulating and planarizing layer 32. A second layer 24, or transparent electrode 12 itself, may then be formed over the sacrificial layer, the second layer 24 or electrode 12 having openings 40 exposing portions of the sacrificial layer. An etchant 36 may then be employed to etch the materials 26" of the sacrificial layer 26' away, leaving a cavity beneath the second layer 24 or electrode 12 forming the optical isolation cavity 26. Further layers, for example the scattering layer 22 or transparent electrode 12 may be formed over the second layer 24. The second layer 24 or electrode 12 may be supported over the isolation cavity 26 by walls 42 adjacent to the light emitting areas 60 or by pillars of support material formed in the light-emissive area 60. The walls 42 or pillars may comprise the same materials as the second layer 24 and be formed in a common patterning step. In such an embodiment, the sacrificial layer is formed only in the light-emissive area 60.

Materials and etchants known in the photolithographic industry may be employed to form the sacrificial layer 26' and/or second layer 24. In particular, the micro-electromechanical systems (MEMS) art describes useful techniques, as described in commonly assigned U.S. Pat. No. 6,238,581 entitled "Process for manufacturing an electromechanical grating device". This disclosure describes a method for manufacturing a mechanical grating device comprising the steps of: providing a spacer layer on top of a protective layer which covers a substrate; etching a channel entirely through the spacer layer; depositing a sacrificial layer at least as thick as the spacer layer; rendering the deposited sacrificial layer optically coplanar by chemical mechanical polishing; providing a tensile ribbon layer completely covering the area of the channel; providing a conductive layer patterned in the form of a grating; transferring the conductive layer pattern to the ribbon layer and etching entirely through the ribbon layer; and removing entirely the sacrificial layer from the channel. With respect to the present invention, such a process can be simplified since the requirement for chemical mechanical polishing and the grating structure are unnecessary. Likewise, U.S. Pat. Nos. 6,307,663 and, in particular, 6,663,788 describe further devices having cavities and methods for forming cavities useful in the present invention. For example, the sacrificial layer may comprise a silicon, including a polysilicon or a silicon oxide, or an organic polymer, including a polyamide. The second layer may comprise a silicon nitride, a silicon oxide, or a metal oxide. The choice of materials will depend greatly on the choice of etchants, for example $XeF_2$ can etch silicon, such as polysilicon. Suitable cavities may be formed by employing a sacrificial layer of polysilicon formed over a silicon dioxide layer with a second layer of silicon nitride having photolithographically patterned openings exposing portions of the first sacrificial layer and then etching away the polysilicon sacrificial layer using $XeF_2$ gas. In an alternative embodiment, the sacrificial layer may be silicon dioxide covered with indium tin oxide (ITO) and hydrofluoric acid employed to etch out the silicon dioxide sacrificial layer. In this embodiment, the ITO layer may serve as a transparent electrode 12, thus eliminating the need for a separate second layer 24 and thereby may reduce materials costs, processing steps, and improve optical performance by avoiding light absorption in a separate second layer 24. Such an embodiment may be most useful in the configuration of FIG. 2 that employs a scattering layer 22 adjacent to the reflective electrode 16.

In preferred embodiments, the cover 20 and substrate 10 may comprise glass or plastic with typical refractive indices of between 1.4 and 1.6. Reflective second electrode 16 is preferably made of metal (for example aluminum, silver, or magnesium) or metal alloys. Transparent electrode 12 is preferably made of transparent conductive materials, for example indium tin oxide (ITO) or other metal oxides. The organic material layers 14 may comprise organic materials, for example, hole-injection, hole-transport, light-emitting, electron-injection, and/or electron-transport layers. Such organic material layers are well known in the OLED art. The organic material layers typically have a refractive index of between 1.6 and 1.9, while indium tin oxide has a refractive index of approximately 1.8-2.0. Hence, the various layers 12 and 14 in the OLED have a refractive index range of 1.6 to 2.1. Of course, the refractive indices of various materials may be dependent on the wavelength of light passing through them, so the refractive index values cited here for these materials are only approximate. In any case, the optical isolation cavity 26 preferably has a refractive index at least 0.1 lower than that of the substrate, and thus will also typically have a refractive index lower than that of the organic layers. Most preferably, the optical isolation cavity will have a refractive index close to 1.

Scattering layer 22 may comprise a volume scattering layer or a surface scattering layer. In certain embodiments, e.g., scattering layer 22 may comprise materials having at least two different refractive indices. The scattering layer 22 may comprise, e.g., a matrix of lower refractive index and scattering elements have a higher refractive index. Alternatively, the matrix may have a higher refractive index and the scattering elements may have a lower refractive index. For example, the matrix may comprise silicon dioxide or cross-linked resin having indices of approximately 1.5, or silicon nitride with a much higher index of refraction. If scattering layer 22 has a thickness greater than one-tenth part of the wavelength of the emitted light, then it is desirable for the index of refraction of at least one material in the scattering layer 22 to be approximately equal to or greater than the index of the organic materials or transparent electrode. This is to insure that all of the light trapped in the organic layers 14 and transparent electrode 12 can experience the direction altering effects of scattering layer 22. If scattering layer 22 has a thickness less than one-tenth part of the wavelength of the emitted light, then the materials in the scattering layer need not have such a preference for their refractive indices.

In an alternative embodiment, scattering layer 22 may comprise particles deposited on another layer, e.g., particles of titanium dioxide may be coated over transparent electrode 12 to scatter light. Preferably, such particles are at least 100 nm in diameter to optimize the scattering of visible light. Alternatively, scattering layer 22 may comprise a rough, diffusely reflecting or refracting surface of second electrode 16 or transparent electrode 12.

The scattering layer 22 is typically preferably adjacent to and in contact with, or close to, an electrode to defeat total internal reflection in the organic layers 14 and transparent electrode 12. However, if the scattering layer 22 is between the electrodes 12 and 16, it may not be necessary for the scattering layer to be in contact with an electrode 12 or 16 so long as it does not unduly disturb the generation of light in the OLED layers 14. According to an embodiment of the present invention, light emitted from the organic layers 14 can waveguide along the organic layers 14 and electrodes 12 combined, since the organic layers 14 typically have a refractive index lower than that of the transparent electrode 12 and second electrode 16 is reflective. The scattering layer 22 or a diffuse electrode surface may disrupt the total internal reflection of light in the combined layers 14 and 12 and redirect some portion of the light out of the combined layers 14 and 12.

It is important to note that a scattering layer will also scatter light that would have been emitted out of the device back into the layers 14, exactly the opposite of the desired effect. Hence, the use of optically transparent layers that are as thin as possible is desired in order to extract light from the device with as few reflections as possible.

Referring back to FIG. 1, in operation light is emitted from the organic layer(s) 14 after stimulation by a current passing from one electrode to the other. Light rays 62 and 64 are emitted and may be directly emitted (62) after encountering the scattering layer 22 or may be reflected, re-encounter the scattering layer 22 one or more times before the light ray (64) is scattered into an angle that allows it to escape from the device. Light emitted toward the back of the OLED is reflected from the reflective second electrode 16 and is then scattered by scattering layer 22 and passes either out of the OLED device or is reflected by another layer until it is scattered again. Referring to FIG. 2, light 66 may be directly emitted or light 68 may be reflected and scattered before being emitted.

In either case, scattered or directly emitted light may waveguide in the organic layers 14, transparent electrodes, or the second layer 24. In FIG. 1, in order for light to experience the direction-altering effect of the scattering layer 22, it is helpful if the transparent electrode 12 has a refractive index greater than the refractive index of the organic light-emitting layers 14. Since the scattering layer 22 is immediately adjacent to the transparent electrode 12 opposite the organic layers 14, such an optical index will ensure that no light is trapped within the organic layers 14. The refractive index of the second layer 24 is not critical, since any light that is scattered into the second layer 24 will either pass into the optical isolation cavity 26 or be reflected back to the scattering layer 22 and be re-scattered until the light eventually escapes.

However, in the embodiment of FIG. 2, it is likewise helpful, but not required, for the second layer 24 (if it is separate from the transparent electrode 12) to have a refractive index equal to or larger than the refractive index of the organic layers 14 and/or the transparent electrode 12. Such a refractive index will ensure that no light will be reflected at the interface between the second layer 24 and transparent electrode 12. However, if any such reflection does occur, the light will in any case be scattered by the scattering layer 22 after passing back through the organic layers 14.

The thickness of the second layer 24 is not critical but it is preferably as transparent as possible to the wavelengths of light emitted by the organic layers 14. The second layer 24 should have sufficient thickness to support the layers above the optical isolation cavity 26 and may, for example, have a thickness of 100 nm or more, or 500 nm or more depending on the material employed. It may also be useful for the optical isolation cavity 26 to be thicker than the electrode and organic layers 12, 14, and 16 so that the openings 40 remain open after the deposition of the electrode and organic layers. Such an opening can then be employed to allow an inert gas to pass into any cavity prior to sealing the OLED device with a cover 20, thereby reducing any atmospheric pressure effects that could stress the OLED device.

Figure 8:
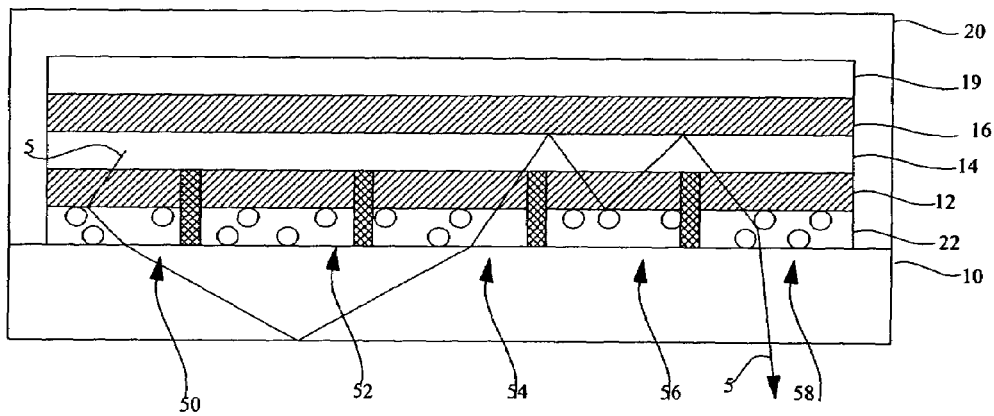
FIG. 8 illustrates a cross section of a prior-art bottom-emitter OLED device having a scattering layer.
Figure 9:
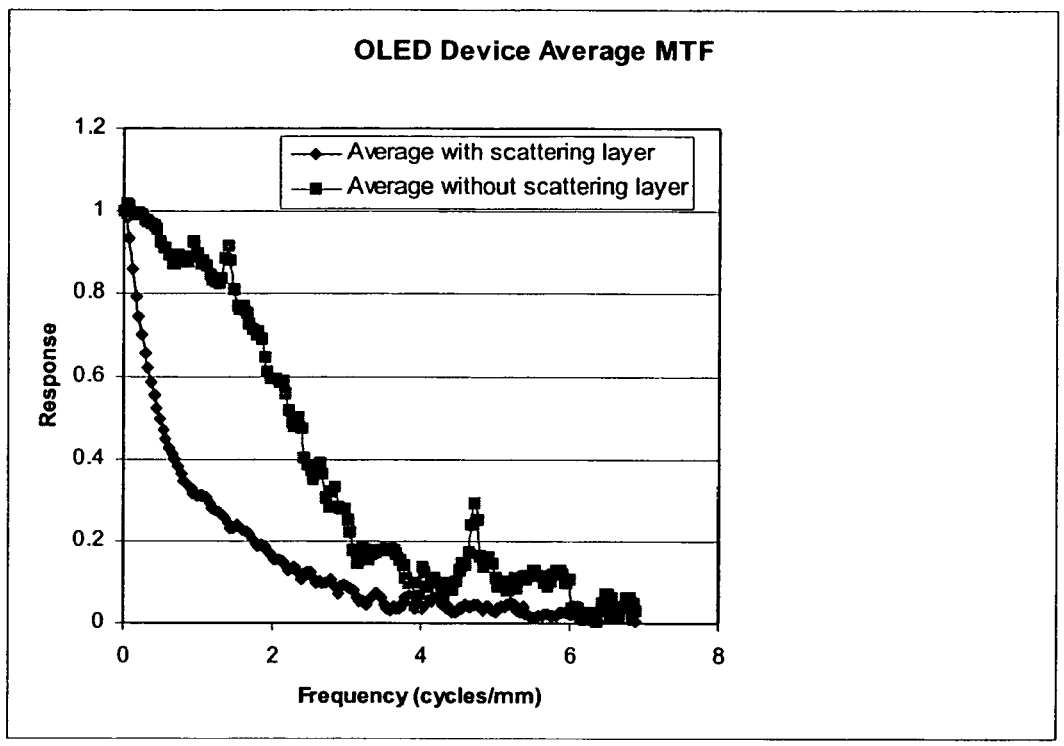
FIG. 9 is a graph demonstrating the loss in sharpness due to a scattering layer in a prior-art active-matrix bottom-emitting OLED device.

It is critical that the optical isolation cavity 26 provide an optically transparent layer having a refractive index lower than that of the substrate, since light passing from a low-index medium (the optical isolation cavity 26) into a higher-index medium (substrate 10 and underlying planarization and insulation layers 32) cannot experience total internal reflection and must be emitted. Hence, light will not experience the losses due to repeated transmission through the substrate 10, or demonstrate the lack of sharpness that results from light being emitted from the organic layers 14 at one point and emitted from the substrate 10 at a distant point, as illustrated in FIGS. 8 and 9. To facilitate this effect, the optical isolation cavity 26 should not itself scatter light, and should be as transparent as possible. The optical isolation cavity 26 is preferably at least one micron thick to ensure that emitted light properly propagates through the optical isolation cavity 26 and is transmitted through the substrate 10.

Whenever light crosses an interface between two layers of differing index (except for the case of total internal reflection), a portion of the light is reflected and another portion is refracted. Unwanted reflections can be reduced by the application of standard thin anti-reflection layers. Use of anti-reflection layers may be particularly useful on both sides of the transparent substrate 10.

The scattering layer 22 can employ a variety of materials. For example, randomly located spheres of titanium dioxide may be employed in a matrix of polymeric material. Alternatively, a more structured arrangement employing ITO, silicon oxides, or silicon nitrides may be used. In a further embodiment, the refractive materials may be incorporated into the electrode itself so that the electrode is a scattering layer. Shapes of refractive elements may be cylindrical, rectangular, or spherical, but it is understood that the shape is not limited thereto. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 μm. It is generally preferred to avoid diffractive effects in the scattering layer. Such effects may be avoided, for example, by locating features randomly or by ensuring that the sizes or distribution of the refractive elements are not the same as the wavelength of the color of light emitted by the device from the light-emitting area.

The scattering layer 22 should be selected to get the light out of the OLED as quickly as possible so as to reduce the opportunities for re-absorption by the various layers of the OLED device. If the scattering layer 22 is to be located between the organic layers 14 and the optical isolation cavity 26 (as in FIG. 1) or between the organic layers 14 and a reflective layer of electrode 16 (as in FIG. 2), then the total diffuse transmittance of the same layer coated on a glass support should be high (preferably greater than 80%). In alternative embodiments, a transparent electrode 15 may be employed with a reflective scattering layer 23 so that the total diffuse reflectance of the same layer coated on a glass support should be high (preferably greater than 80%). In all cases, the absorption of the scattering layer should be as low as possible (preferably less than 5%, and ideally 0%).

Materials of the light scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide.

Conventional lithographic means can be used to create the scattering layer using, for example, photo-resist, mask exposures, and etching as known in the art. Alternatively, coating may be employed in which a liquid, for example polymer having a dispersion of titanium dioxide, may form a scattering layer 22.

One problem that may be encountered with scattering layers is that the electrodes may tend to fail open at sharp edges associated with the scattering elements in the layer 22. Although the scattering layer may be planarized, typically such operations do not form a perfectly smooth, defect-free surface. Also, particulate contamination during layer deposition may cause electrodes to form electrical shorts. To reduce the possibility of shorts between the electrodes 12 and 16, a short-reduction layer (not shown) may be employed between the electrodes. Such a layer is a thin layer of high-resistance material (for example having a through-thickness resistivity between $10^{-7}$ ohm-$cm^2$ to $10^3$ ohm-$cm^2$). Because the short-reduction layer is very thin, device current can pass between the electrodes through the device layers but leakage current through the shorts are much reduced. Such layers are described in US2005/0225234, the disclosure of which is incorporated herein by reference.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

Figure 3:
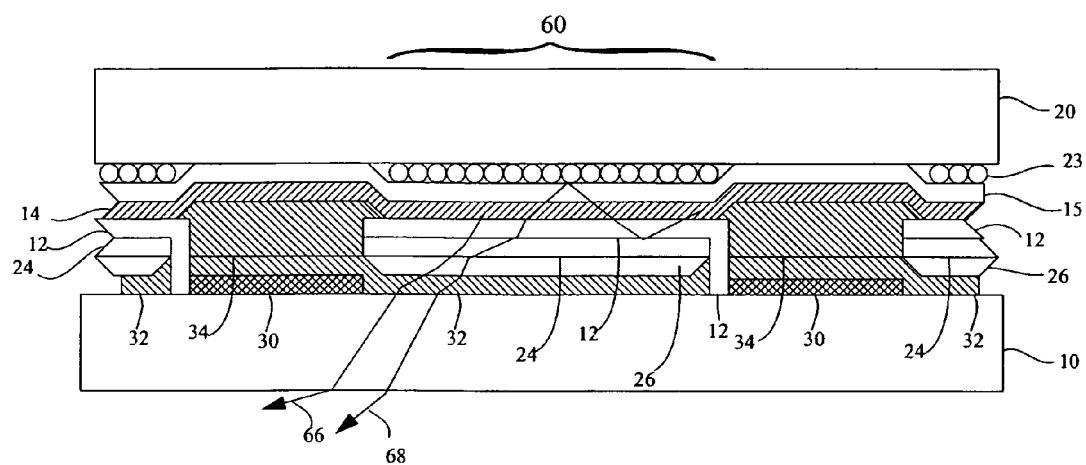
FIG. 3 illustrates a side view of an OLED device having an optical isolation cavity and a reflective scattering layer adjacent to a transparent electrode according to yet another alternative embodiment of the present invention.

In particular, in the embodiment of FIGS. 2 and 3, very thin layers of transparent encapsulating materials, preferably conductive, may be deposited on the transparent conductive layer 15. In this case, the scattering layer 22, 23 may be deposited over the layers of encapsulating materials. This structure has the advantage of protecting the conductive layer 15 during the deposition of the scattering layer 22. Preferably, the layers of transparent encapsulating material has a refractive index comparable to the refractive index range of the transparent electrode layer and organic layers, or is very thin (e.g., less than about 0.2 micron) so that wave guided light in the transparent electrode layer and organic layers will pass through the layers of transparent encapsulating material 31 and be scattered by the scattering layer 22, 23.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, or providing colored, neutral density, or color conversion filters over the display. Filters and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4, 5 light rays
10 substrate
12 transparent electrode
14 organic layer(s)
15 second electrode transparent conductive layer 16 second electrode
17 second electrode reflective conductive layer
19 gap
20 cover
22 scattering layer
23 reflective scattering layer
24 second layer
26 optical isolation cavity
26' sacrificial layer
26" materials of sacrificial layer
30 thin-film electronic components
32 insulating layer
34 insulating layer
36 etchant
40 opening
42 wall
50, 52, 54, 56, 58 pixels
60 light-emitting area
62, 64, 66, 68 light rays

The invention claimed is:

1. A bottom-emitting organic light-emitting diode (OLED) device, comprising:
    a transparent substrate through which light is emitted;
    an optical isolation cavity formed over the substrate having a refractive index lower than the refractive index of the substrate;
    a transparent electrode formed over the optical isolation cavity;
    one or more layers of organic light-emitting material formed over the transparent electrode;
    a second electrode formed over the one or more layers of organic light-emitting material, said second electrode being reflective; and
    a light-scattering layer formed over the optical isolation cavity;
    wherein the transparent electrode or a second layer formed between the optical isolation cavity and the transparent electrode comprises one or more openings leading to the optical isolation cavity, and the cavity is formed by etching a sacrificial layer deposited between the substrate and the transparent electrode or the second layer through the one or more openings.

2. The OLED device of claim 1, wherein the light-scattering layer is located between the optical isolation cavity and the transparent electrode.

3. The OLED device of claim 1, wherein the light-scattering layer is adjacent to and in contact with either the transparent electrode or the second electrode.

4. The OLED device of claim 1, wherein the scattering layer is formed between the transparent electrode and the second electrode.

5. The OLED device of claim 1, wherein the second electrode comprises a transparent, conductive layer formed over the one or more layers of organic light-emitting material and a reflective, conductive layer formed over and in electrical contact with the transparent, conductive layer, and the scattering layer is formed between the transparent and reflective conductive layers.

6. The OLED device of claim 5, wherein the light-scattering layer is formed between the transparent, conductive layer and the reflective, conductive layer over only a first portion of the transparent, conductive layer, wherein the light-scattering layer is relatively less conductive than the reflective, conductive layer and the reflective, conductive layer is in electrical contact with the transparent, conductive layer over a second portion of the transparent, conductive layer where the light-scattering layer is not formed.

7. The OLED device of claim 1, wherein the second electrode is transparent and a reflective scattering layer is formed over the second electrode.

8. The OLED device of claim 1, wherein the optical isolation cavity is filled with a gas.

9. The OLED device of claim 8, wherein the gas is air, helium, nitrogen, or argon.

10. The OLED device of claim 1, further comprising a short reduction layer formed between the transparent electrode and the second electrode.

11. The OLED device of claim 1, wherein the optical isolation cavity is at least 1 micrometer thick.

12. The OLED device of claim 1, comprising a second layer formed over the optical isolation cavity that comprises one or more openings leading to the optical isolation cavity and wherein the second layer comprises a silicon nitride or a silicon oxide.

13. The OLED device of claim 1, comprising a transparent electrode formed over the optical isolation cavity that comprises one or more openings leading to the optical isolation cavity.

14. A method of making a bottom-emitting organic light-emitting diode (OLED) device, comprising:
    providing a transparent substrate through which light may be transmitted;
    forming a first sacrificial layer over the substrate;
    forming a second layer over the first sacrificial layer, the second layer being etchant resistant relative to the first sacrificial layer and having openings exposing portions of the first sacrificial layer;
    etching the sacrificial layer away through the openings in the second layer to form an optical isolation cavity over the substrate having a refractive index lower than the refractive index of the substrate;
    forming a transparent electrode over the optical isolation cavity;
    forming one or more layers of organic light-emitting material formed over the transparent electrode;
    forming a second electrode over the one or more layers of organic light-emitting material, said second electrode being reflective; and
    forming a light-scattering layer formed over the optical isolation cavity.

15. The method of claim 14, wherein the sacrificial layer comprises polysilicon or a silicon oxide.

16. The method of claim 14, wherein the second layer comprises a silicon, a silicon nitride or a silicon oxide.

* * * * *